(12) United States Patent
Chuah et al.

(10) Patent No.: US 9,147,910 B2
(45) Date of Patent: Sep. 29, 2015

(54) METHOD AND SYSTEM FOR CONTROLLING ENERGY STORAGE DEVICE

(75) Inventors: Christopher James Chuah, Schenectady, NY (US); Roger Bull, Burton Upon Trent (GB); James Sudworth, Burton Upon Trent (GB); Vincent Boccanfuso, Schenectady, NY (US); David James, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 905 days.

(21) Appl. No.: 13/338,380

(22) Filed: Dec. 28, 2011

(65) Prior Publication Data
US 2013/0169234 A1 Jul. 4, 2013

(51) Int. Cl.
*H02J 7/00* (2006.01)
*H01M 10/44* (2006.01)
*H01M 10/48* (2006.01)
*G01R 31/36* (2006.01)

(52) U.S. Cl.
CPC ............ *H01M 10/44* (2013.01); *H01M 10/443* (2013.01); *H01M 10/448* (2013.01); *H01M 10/48* (2013.01); *H01M 10/486* (2013.01); *G01R 31/3624* (2013.01); *G01R 31/3679* (2013.01)

(58) Field of Classification Search
CPC ...................................................... H01M 10/44
USPC .................................................. 320/134–136
See application file for complete search history.

(56) References Cited

U.S. PATENT DOCUMENTS

| 4,595,880 | A | 6/1986 | Patil |
| 4,876,513 | A | 10/1989 | Brilmyer et al. |
| 5,658,682 | A | 8/1997 | Usuda et al. |
| 5,912,544 | A | 6/1999 | Miyakawa et al. |
| 6,087,808 | A | 7/2000 | Pritchard |
| 6,300,763 | B1 | 10/2001 | Kwok |
| 6,469,512 | B2 | 10/2002 | Singh et al. |
| 6,842,708 | B2 | 1/2005 | Odaohhara |
| 7,061,246 | B2 | 6/2006 | Dougherty et al. |

(Continued)

FOREIGN PATENT DOCUMENTS

DE 19805267 A1 8/1999
DE 102006017889 A1 10/2007

(Continued)

OTHER PUBLICATIONS

Search Report and Written Opinion from corresponding PCT Application No. PCT/US2012/067864 dated Mar. 14, 2013.

*Primary Examiner* — Richard V Muralidar
(74) *Attorney, Agent, or Firm* — Dority & Manning, P.A.

(57) ABSTRACT

A system and method of use including a controller responsive to a deviation in absolute value or relative slope and operable to terminate a discharge operation in an energy storage device is provided. The absolute value or relative slope is determined at sampling frequency based upon a combination of measured operating parameters, for example, potential and current. Any deviation in the absolute value or relative slope indicates that a threshold limit in the available energy of the system has been reached, for example when active materials in the device are at a point of depletion, indicating a need to cease the discharge operation. The system and method operate on a real-time basis, providing instantaneous SOH information with regard to the device.

9 Claims, 6 Drawing Sheets

(56) References Cited

U.S. PATENT DOCUMENTS

| | | |
|---|---|---|
| 7,541,775 B2 | 6/2009 | Lee |
| 7,683,580 B2 | 3/2010 | Matsushima et al. |
| 7,872,449 B2 | 1/2011 | Gutlein |
| 2006/0022676 A1 | 2/2006 | Uesaka et al. |
| 2007/0279065 A1* | 12/2007 | Gutlein .................. 324/430 |
| 2012/0212184 A1 | 8/2012 | Klein et al. |

FOREIGN PATENT DOCUMENTS

| | | |
|---|---|---|
| FR | 2952235 A1 | 5/2011 |
| GB | 2377833 | 1/2003 |

\* cited by examiner

METHOD AND SYSTEM FOR CONTROLLING ENERGY STORAGE DEVICE

FIELD

Embodiments of the invention relate to energy storage devices. Other embodiments relate to methods for determining state of charge of an energy storage device.

BACKGROUND OF THE DISCLOSURE

Various power applications require reliable battery operation and accurate monitoring during operation. For example, an Uninterruptible Power Supply (UPS) provides back-up power to a load, such as a computing or telecommunications device, when a primary power source has stopped providing power (e.g., due to failure). Accurate monitoring of the UPS battery charge state allows the user to suitably save information and shutdown the device prior to the UPS battery reaching end-of-discharge conditions. As another example, an electric vehicle battery provides power to propel the vehicle. Accurate monitoring of the vehicle battery discharge state provides an indication to an operator of the electric vehicle of how long they can drive the electric vehicle before stopping to prevent over discharge damage to the vehicle battery.

In recent approaches, a battery system is monitored by continuously tracking data from multiple sensors, and comparing this data to stored data accumulated from the battery on its initial discharge cycle, or to a theoretically-based model of the battery's estimated discharge capacity as a function of use or cycles, and then applying a calculation sequence to determine the state-of-charge of the battery. Due to the use of complicated sensors and calculations, including the storing and use of accumulated data over the life of the battery or over one or more discharge cycles, such systems can prove costly and cumbersome. Further, this type of system requires the use of multiple sensors to collect data, a means to accumulate the data and extrapolate or determine state-of-life of the battery (remaining life of the battery in regards to remaining cycles, usable charge, etc.), and may nonetheless terminate discharge too early due to false reads from the sensors caused by: age of the battery or of any one cell in a battery having one or more cells or units; variation in individual battery manufacture; use of mixed battery chemistry that generates a false termination indicator as one reactant is depleted and a second continues to be viable; detection limits of the sensors; or the like. Further, due to these same parameters, the data may generate a false indicator of remaining life, causing the battery to undergo over-discharge, and potentially damaging the battery. In either instance, the status determination of the state of life and/or health of the battery is potentially inaccurate, resulting in the under usage or over usage of the battery, which in the latter instance can lead to permanent damage and the need to replace the battery.

Therefore, it would be desirable to have a system and method for determining state-of-charge, -life, and/or -health of a battery that is determined independent of those parameters that can cause false readings in known methods and systems, and which can make such systems cumbersome and costly to operate and maintain.

BRIEF DESCRIPTION OF THE INVENTION

In one embodiment, a management system is provided, the system including a measurement device operably coupled with an energy storage device. The measurement device is configured to measure two or more operating parameters of the energy storage device. The system includes a controller configured to determine discharge effectiveness indicators of the energy storage device from the measured operating parameters at a designated frequency. The controller is further configured to assess at least one of relative slopes or absolute values of the discharge effectiveness indicators. The relative slopes or absolute values are used for instantaneous detection of a deviation in one of the relative slopes or absolute values representing a threshold limit of a state-of-charge of the energy storage device. Upon the detection of the deviation, the controller can do one or both of the following: signal an end of a discharge operation for the energy storage device, i.e., EOD, and/or terminate the discharge operation responsive to the detection.

In one embodiment, the device is an energy storage device and the parameters measured may be potential and current, plotted as a function of time. In another embodiment, the parameters measured may be discharge resistance in Ohms, plotted as a function of time. In yet another embodiment, the parameters measured may be voltage, plotted as a function of time. In any of the foregoing systems, because the measurements and calculations are instantaneous, and at sampling frequency, and represent only the actual operation of the device at that moment, variations in devices caused by, for example, state-of-health of the device initially, operating temperature, manufacturing variation, and the like, as well as the device being a device having mixed chemistry, are irrelevant to the determination of the discharge effectiveness of the device.

Because the disclosed management system provides for both the measuring of parameters and the calculating of a discharge effectiveness indicator therefrom, and then the determination of absolute value and relative slope of the discharge effectiveness indicator in real time, or dynamically, there is little, if any, chance of under- or over-discharging of the energy storage device. It is important to note that the measurements and calculations, and thus the relative slope, are determined independent of various parameters that have proven detrimental in more complicated and cumbersome systems proposing to provide the same information.

Also provided is a method for controlling an energy storage system. The method involves initiating a discharge operation in an energy storage system that is in operable communication with a controller, and measuring potential and current of the system. The controller performs instantaneous calculations based on the measurements to determine a discharge effectiveness indicator for the system, and to further generate an energy curve from at least one of the absolute value or the relative slope of the discharge effectiveness indicator. The measurements and calculations may be repeated, at a sampling frequency, until a deviation in at least one of the absolute value or the relative slope is detected, at which time the controller either signals that the energy storage system is near end-of-discharge, terminates the discharge operation of the energy storage system, or does both.

In one embodiment, the system includes at least two or more energy storage cells or units. In this scenario, though individual cells or units represent potential variations in age, state-of-health, manufacturing particulars, the effect of operating temperature on the individual cells or units, etc., because the system is measuring the operating parameters for the entire device, such variations become irrelevant. The system instead generates a discharge effectiveness indicator-based curve representative of the state of the energy storage device as a whole at any given time, i.e. instantaneously or dynamically, and only the relative slope of this curve is used to determine the discharge effectiveness of the device over time.

Also provided is a method for determining state-of-health of an energy storage system. The method involves initiating a discharge operation in an energy storage system that is in operable communication with a controller, and measuring at least two operating parameters of the system. The controller performs calculations based on the measurements to determine a discharge effectiveness indicator for the system, and to further generate an energy curve from at least one of the absolute value or the relative slope of the discharge effectiveness indicator. The measurements and calculations may be repeated, at a sampling frequency, to assess the state-of-health of the energy storage system from the energy curve.

In another embodiment of a management system, the management system comprises a measurement device configured to be operably coupled with an energy storage device for measuring two or more operating parameters of the energy storage device during a discharge operation of the energy storage device. The management system additionally comprises a controller that is configured to periodically determine a discharge effectiveness indicator of the energy storage device from the measured operating parameters. For example, the controller may be configured to calculate the discharge effectiveness indicator once every "n" seconds (n=real positive number), where n is chosen for the discharge effectiveness indicator to be calculated at least "m" times in a typical discharge operation (m=real positive number, e.g., 50 or 100). As such, the regular interval of seconds, n, is determined based on a number of times, m, during an average length of the discharge operation, t, that the discharge effectiveness indicator is to be calculated, such that n=t/m. The controller is further configured, when the discharge effectiveness indicator is determined (e.g., each time the discharge effectiveness indicator is determined, or some subset of the number of times it is determined), to detect a deviation in at least one of a relative slope or an absolute value of the discharge effectiveness indicator. The deviation is representative of an end of discharge threshold limit of the energy storage device. Responsive to detecting the deviation, the controller is configured to signal an end of the discharge operation and/or terminate the discharge operation.

These and other advantages of the invention will become apparent based upon the concepts and innovations described in more detail herein.

BRIEF DESCRIPTION OF THE DRAWINGS

The present invention will be better understood from reading the following description of non-limiting embodiments, with reference to the attached drawings, wherein:

FIG. 5 is a graph of a discharge effectiveness indicator based on resistance change (dV/dA) as a function of capacity (Ah) demonstrating a positive deviation in the relative slope of the energy curve.

DETAILED DESCRIPTION

Embodiments of the invention relate to a system and method for dynamically determining discharge effectiveness of an energy storage device, and terminating discharge of the device upon detecting that a threshold limit within the operating parameters of the device has been reached, without under- or over-discharging the energy storage device. More particularly, power delivery performance capability is dynamically assessed based on an instantaneous or real-time detection of a deviation in the relative slope of a discharge effectiveness indicator of the energy storage device generated by the system. The discharge effectiveness indicator may be, for example, that of instantaneously measured potential and capacity, of discharge resistance and time, of voltage and capacity, or of any other parameters having a linear relationship.

Figure 1:
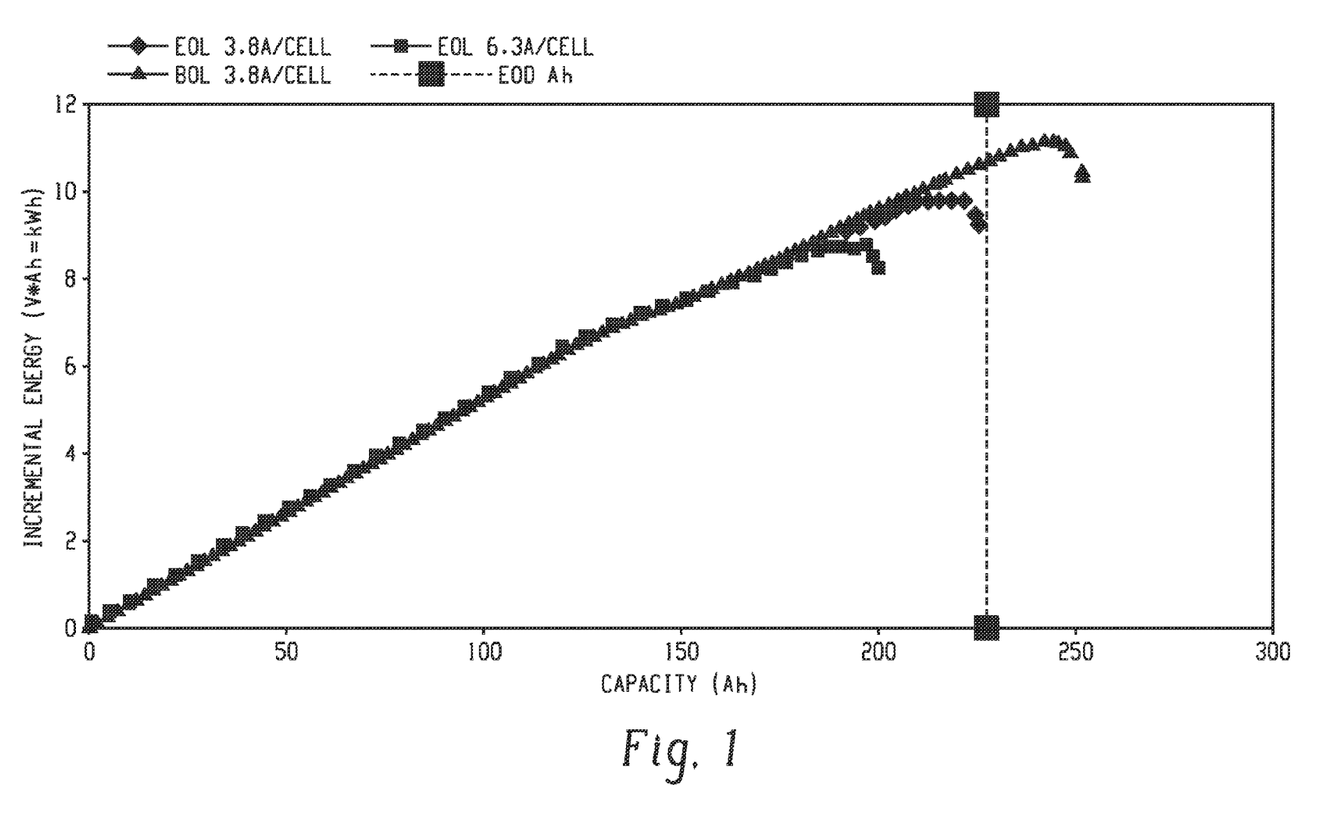
FIG. 1 is a graph of a discharge effectiveness indicator based on incremental energy (V*Ah=kWh) as a function of capacity (Ah) demonstrating a deviation in the relative slope of the energy curve.
Figure 2:
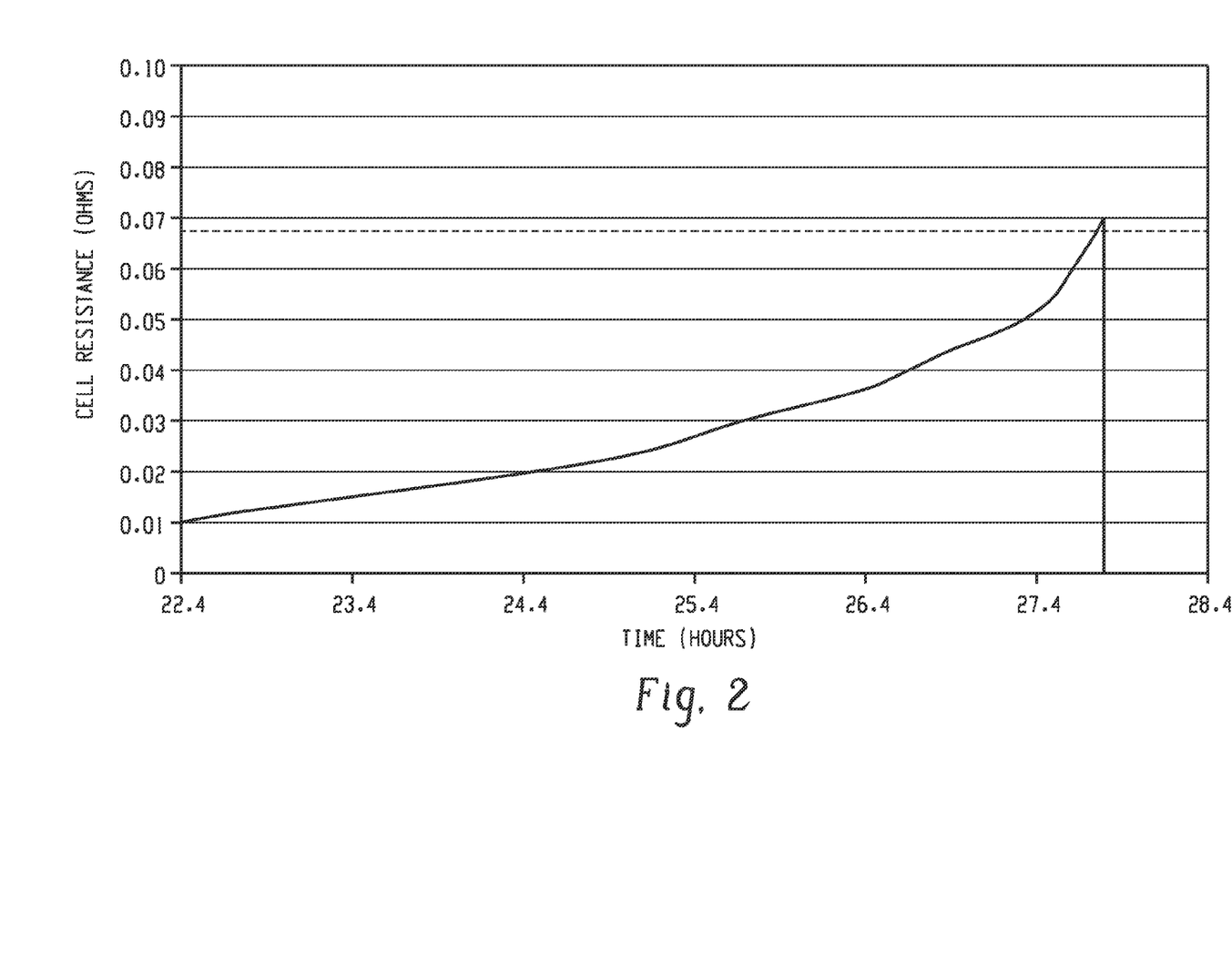
FIG. 2 is a graph of a discharge effectiveness indicator of resistance (Ohms) as a function of time (t).

As used herein, the terms "instantaneous", "real time," and "dynamic," which may be used interchangeably, refer to the current state-of-health (SOH) of the energy storage device with regard to energy output, regardless of other parameters that may affect device operation. Embodiments of the current system, as compared to other systems, are differentiated by the lack of a need to compare assessed performance values to those of a model generated according to theoretical values, or to look-up tables incorporating previous device performance history. Instead, in embodiments of the disclosed system and method, the measurements are taken, transmitted to a computing device, for example a controller, and the computing device processes the measurements (according to an algorithm embodied in a set of instructions for controlling the computing device) to generate a discharge effectiveness indicator having either an absolute value or a relative slope relative to previously observed values. "Relative slope" as used herein means an assessment of how the discharge effectiveness indicator is changing with respect to time and is based upon the most recently calculated values of discharge effectiveness. As measurements (of energy storage device operating parameters) continue to be taken and the relative slope calculated, the computing device assesses the relative slope values calculated for deviation or variation. Depending on the measured parameters, that deviation may be a negative deviation, for example as seen when the discharge effectiveness indicator is based upon energy storage device potential multiplied by discharged capacity versus the discharge capacity removed from the energy storage device (as shown in FIG. 1), or a positive deviation, for example as seen when the parameters measured include energy storage device resistance versus charge removed (as shown in FIG. 7), or energy storage device resistance versus time (as shown in FIG. 2).

The system measures energy storage device operating parameters at a specified frequency, referred to herein as a sampling frequency, and uses the same to determine end-of-discharge (EOD) of the energy storage device. The term "sampling frequency" refers to the number of times a measurement or calculation based on the measurement is performed over the duration of a complete discharge cycle of the energy storage device. For example, the operating parameters being assessed could be measured at least 100 times over the duration of the discharge cycle in order to ensure that the EOD indicator (the discharge effectiveness indicator) will be based upon sufficient information and will ensure that the energy storage device will not be unduly over- or under-utilized (discharged) in the application. For example, with respect to the amount of charge remaining in the energy storage device, and if the operating parameters are measured 100 times, it would be expected that upon the first measurement the values would represent 100% available energy for discharge. As discharge proceeds, and the SOC is measured, for example for the $50^{th}$ time, the remaining energy available for discharge may be only 50% of the initial available energy or charge. By the time the parameters have been measured 90 or 95 times, the device SOC may be down to about 10% or only 5%, at which time discharge of the device can be terminated without having over-discharged or under-discharged the device. Based on the foregoing, the controller may be programmed to calculate the discharge effectiveness indicator at regular intervals, such that, during an average length of the discharge operation, t, the calculation may be made at a regular interval of seconds, n, wherein n is a positive real number, based on a number of times, m, that the discharge effectiveness indicator is to be calculated, e.g. n=t/m. The system is further configured to identify a deviation in the relative slope being calculated by the system (e.g., such a deviation may occur upon reaching a SOC of about 10% or lower), which is interpreted by the system as an indication that a "threshold limit" in the energy storage device has been reached and that discharge should be terminated. The threshold limit of the energy storage device correlates to an end-of-discharge state of the energy storage device, wherein about 10% or lower energy remains available for charge in the energy storage device, e.g. the threshold limit is reached when a state-of-charge of the energy storage device is between about 1% to about 10% of a true capacity state-of-charge of the energy storage device prior to initiation of the discharge operation.

The detection of an absolute value or a relative slope deviation may be based on the comparison of consecutive calculated values as compared to each other. As such, even if the energy storage device is operating to less than full capacity due to age, environmental effect on the energy storage device, e.g. heat, manufacturing defect, or the like, the slope between measured points will be consistent with the present state of the energy storage device, i.e. it indicates the actual or true capacity of the energy storage device to delivery energy. This real-time, or instantaneous, method of assessing the health or capability of the energy storage device captures the effects of these variations without the need for excessive calculations or modeling, or the use of look-up tables. This may be seen more clearly with regard to systems having more than one cell or unit, e.g., an energy storage system having more than one internal battery/cell/unit. Because each battery/cell/unit may behave differently from any other battery/cell/unit in the energy storage system for one or more of the foregoing reasons, the use of only real-time indicators, or a relative slope, to determine EOD may be advantageous. For example, according to aspects of the invention, the method and system forego the potential problem of false reading with regard to the actual, real-time SOC of the device. (Such problems might be caused by using pre-measured values, such as look-up tables or prior performance or even calculations that attempt to take into consideration variations from device to device, as is done in prior systems, which do not account for the type of defects mentioned.) In embodiments of the invention, this is accomplished by calculating the absolute value or relative slope of a discharge effectiveness indicator based on only the actual, real-time measurements of a selected performance/operational parameter, and the assessment of that absolute value or relative slope after each calculation, allowing detection of a deviation in the slope. As consecutive absolute value or relative slope values are determined, a linear curve is established until the energy storage device capacity nears end-of-discharge (EOD), for example representing a remaining discharge capacity of about 1-10%, at which time the slope of the curve deviates from its linear behavior. As such, the discharge effectiveness is derived dynamically from observed measurements of energy storage device operating parameters, previously stored values of energy storage device discharge effectiveness over some or all of the most recent discharge cycle, or extrapolation from limited energy storage device operating parameter data, e.g., collected from a portion of the most recent discharge cycle.

The use of deviation or change in the relative slope of a dynamically generated energy curve to determine EOD applies to various end-user needs, such as determining the amount of operating time left in an energy storage device or distance that can be traveled in a vehicle using the energy storage device. Similarly, the data can be used to determine whether maximum power delivery is used or a lesser power state is implemented to prolong operation of the energy storage device. As such, embodiments of the method and system provided herein allow for the efficient and accurate use of "user-defined targets." The system and method may provide improved accuracy with regard to determining SOC of the energy storage device, whether a single-cell energy storage device or a multi-cell device, based on instantaneous data assessment.

In one embodiment, the measured operational parameters include energy storage device potential and charge removed. The system multiplies the energy storage device potential by the charge removed, and this product is assessed as a function of the charge removed. That is, the system assesses battery potential multiplied by charge removed versus charge removed, or battery potential multiplied by capacity of the energy storage device versus capacity. FIG. 1 provides a representative curve generated from the actual data of a system in accord herewith. This differs from the use of voltage curves as is common in more conventional systems. The relative slope is based on instantaneous measurements, taken in accord with the foregoing disclosure, of potential multiplied by charge removed, V(t)*Ah(t), plotted as a function of Ah(t), wherein the indicator of discharge effectiveness is defined by the expression:

$$DischEff = V^* Int(Idt)$$

wherein:
V* is potential; and
dt is differential operator of time;
and the definition of the relative slope of the discharge effectiveness is defined by the expression:

$$RelSlope(k) = \{DischEff(k) - DischEff(k-1)\}/\{Ah(k) - Ah(k-1)\}$$

wherein:
k is the index for the presently derived parameter; and
k−1 is the index for the previously derived parameter.
Here then, V(t)*Ah(t) is calculated, and plotted on the y-axis, as a function of capacity, Ah, plotted on the x-axis. The curve is shown to have a linear progression throughout discharge until the slope indicates a deviation has occurred, seen in this FIG. 1 as a downward turn of the relative slope.

In another embodiment, the measured operational parameters include cell resistance and time. FIG. 2 provides a representative curve generated from the actual data of a system in accord herewith. The relative slope is based on instantaneous measurements of discharge resistance in Ohms plotted as a function of time, wherein the relative slope is defined by the expression:

$$R_{disch(t)} = \frac{V_{oc} - V(t)}{I(t)}$$

wherein:

$R_{disch}$ is the discharge resistance of the energy storage device (Ohms);

$V_{oc}$ is the open circuit potential (Volts);

V (t) is the most recent measurement of energy storage device potential (Volts)

I(t) is the most recent measurement of current (Amps).

As can be seen, the curve in FIG. 2 has a linear progression until it reaches a point at which the absolute value reaches a threshold. The horizontal dashed line identifies the level at which the reactants in the energy storage device are low, indicating a need to terminate discharge operation of the device.

The systems and methods provided generate the discharge effectiveness indicator by recording data points based on the energy storage device parameters selected by the user, e.g., the user defined targets, at regular intervals, for example every 2 seconds, or every 5 seconds, and calculating the relative slope of an energy curve generated from the data points. The curve generated represents real time performance, or instantaneous performance, of the device, and as such provides an instantaneous measure of the current state of health of the energy storage device. Because the curve is continually generated during operation, a change in the relative slope of the curve is nearly immediately detectable by the controller, thus reducing possibility for over discharge of the device. In addition, because the curve is being generated independent of those factors that can provide false indicators of the SOC of the device, there is little opportunity for premature termination of discharge. An example of a false indicator may be seen in devices having mixed battery chemistry. In such devices, there may be a change in the discharge curve as one reactant is depleted, as seen for example in FIG. 3, at about 140 Ah, where a slight drop in potential is observed as the higher potential reactant is depleted and the lower potential reactant is used in a battery having mixed chemistry. Using other systems to determine SOC of the device, this change could be interpreted as an EOD event causing early termination of discharge, when in fact the battery can continue to operate on the second reactant. In the current system and method, however, this change over in reactant will not generate a substantial deviation in the relative slope, and thus the false indication of EOD is not generated and operation is not prematurely terminated.

Figure 3:
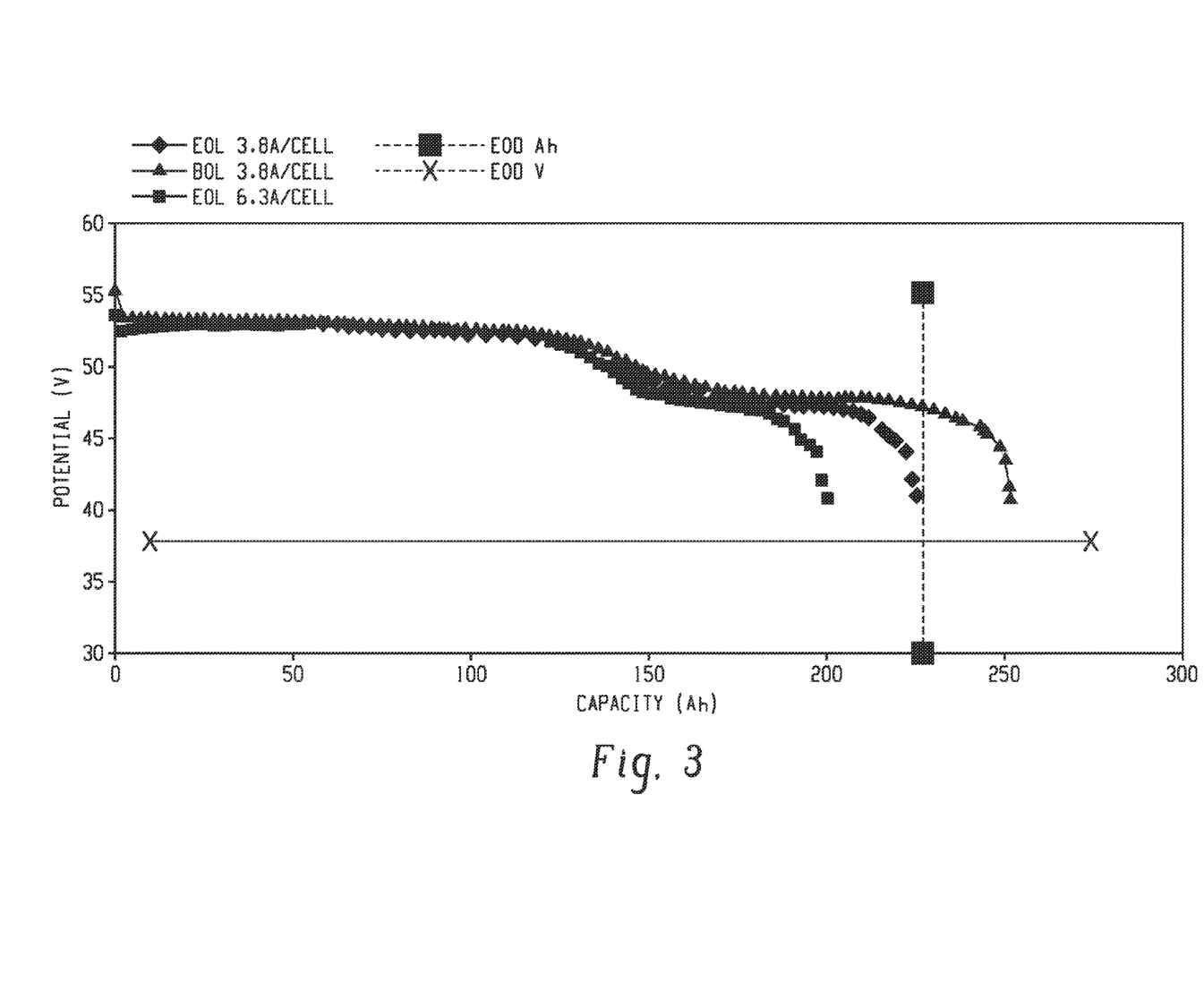
FIG. 3 is a graph of discharge curves for batteries of various ages or conditions based on potential (V) as a function of capacity (Ah).

With further reference to FIG. 3, there is shown a comparison of data curves using known systems and methods. In one known system commonly used to determine state of health of a battery or other energy storage device, generally two parameters are programmed into the system to predict SOH. One parameter may be capacity measured in units of (Ah). Use of this parameter requires that the system include a very accurate sensor for current. If the sensor is even slightly off, for example if the device has experienced some damage or degradation, or if there is a change in rate, the sensor reading can be completely inaccurate. This can result in an indication of EOD farther into discharge and beyond actual depletion of reactant, causing permanent damage to the energy storage device. All batteries and other energy storage devices will age differently, depending on manufacture, load variability, age, voltage variability, chemistry, and other device parameters. Going back to FIG. 3, the curve shown that terminates discharge at about 250 Ah capacity correlates to such a system that has potentially over-estimated the true capacity of the energy storage device and would prematurely terminate operation. Those curves terminating discharge at about 200 Ah and 225 Ah represent energy storage devices that are identical in all aspects except variation in load, e.g., the 200 Ah terminated energy storage device had a 6.3 A load while the 250 Ah terminated energy storage device had a 3.8 A load. Again, this variation in load is shown to cause termination at different states of discharge. The three curves in FIG. 3 indicate how an actual energy storage device can behave differently with respect to age, temperature, and other factors. Embodiments of the disclosed invention provide a means of determining when each of these three behaviors leads to an appropriate EOD indicator by way of the described discharge effectiveness indicators.

Figure 4:
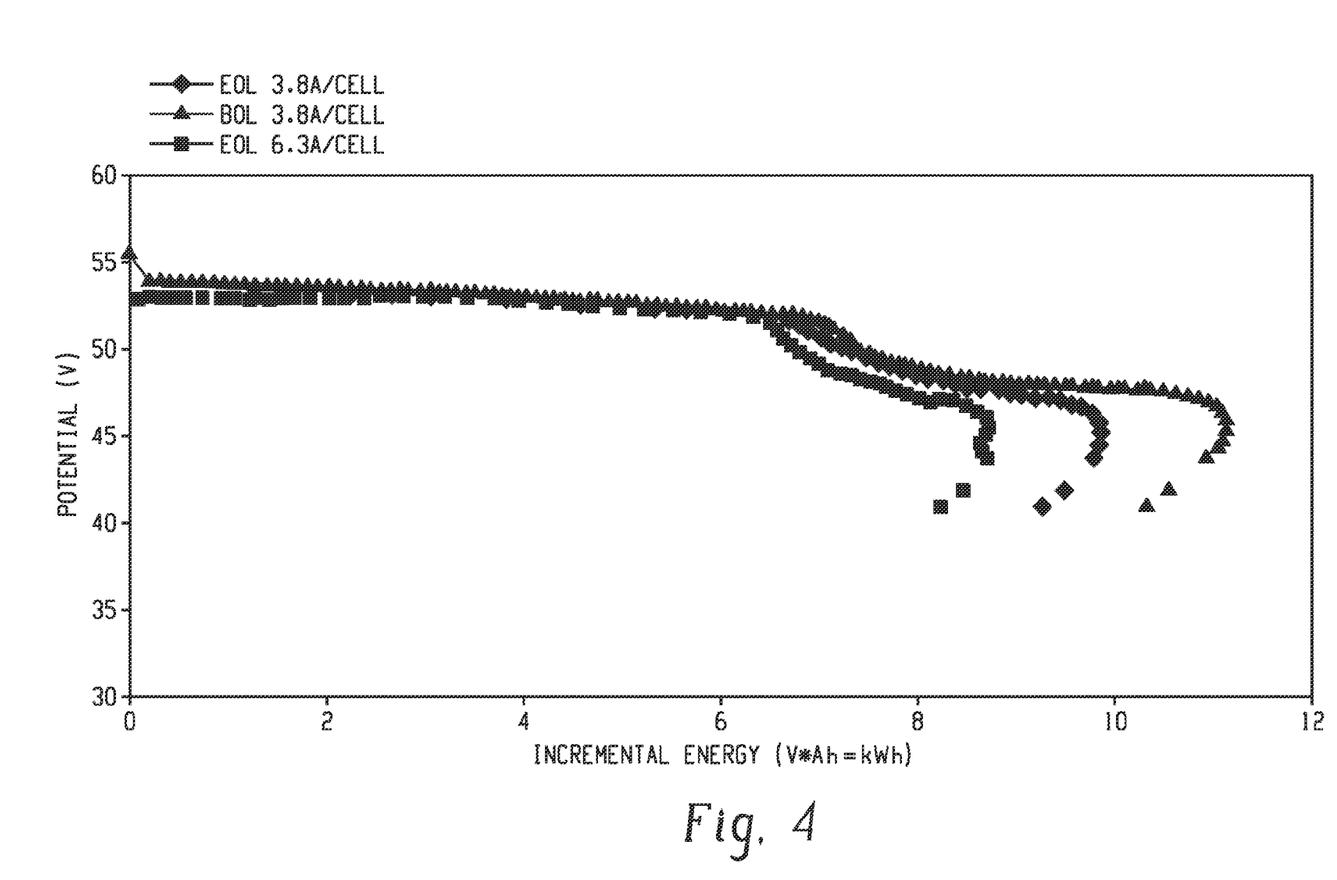
FIG. 4 is a graph of a discharge effectiveness indicator based on potential (V) as a function of incremental energy (V*Ah=kWh).

FIG. 4 provides a graph of an energy curve representing potential (i.e., voltage), V, as a function of incremental energy, V*Ah=Wh. In this Figure, an embodiment of the system in accord herewith is shown to track a peak in delivered incremental energy and use that as an indication of diminishing discharge effectiveness. When the reserve of active materials in the energy storage device becomes depleted, or reaches a threshold limit, for example less than about 10% operational capacity remaining before total depletion of reactants, a sharp reversal in the voltage vs. incremental energy relationship is observed. This provides a clear indicator, independent of those variables discussed hereinabove, that operation should be terminated to avoid the potential for permanent damage to the battery or other energy storage device. The reversal coincides with that point at which the voltage drops off with no capacity increase.

With reference again to FIG. 1, this Figure provides another energy curve determined in accord with embodiments of the invention. The system and method used generates the curve shown and calculates the relative slope of that curve. The curve represents the incremental energy of the device, V*Ah in kWh, as a function of capacity, Ah, based on the data of the same batteries used to generate the data in FIG. 4. EOD is indicated at 225 Ah by a deviation in the relative slope of the curve. Because there is no need to correct for variables in one or more operational parameters that may affect the curve if generated by other known systems, the indication of deviation accurately indicates the need to cease operation of the device, but foregoes the possibility of underor over-discharge.

FIG. 5, like FIG. 1, provides an indication of discharge effectiveness determined in accord with an embodiment of the invention, but showing the rise in a value of differential resistance. The operational parameters used to generate the curve are based on resistance of the energy storage device as a function of capacity.

Figure 6:
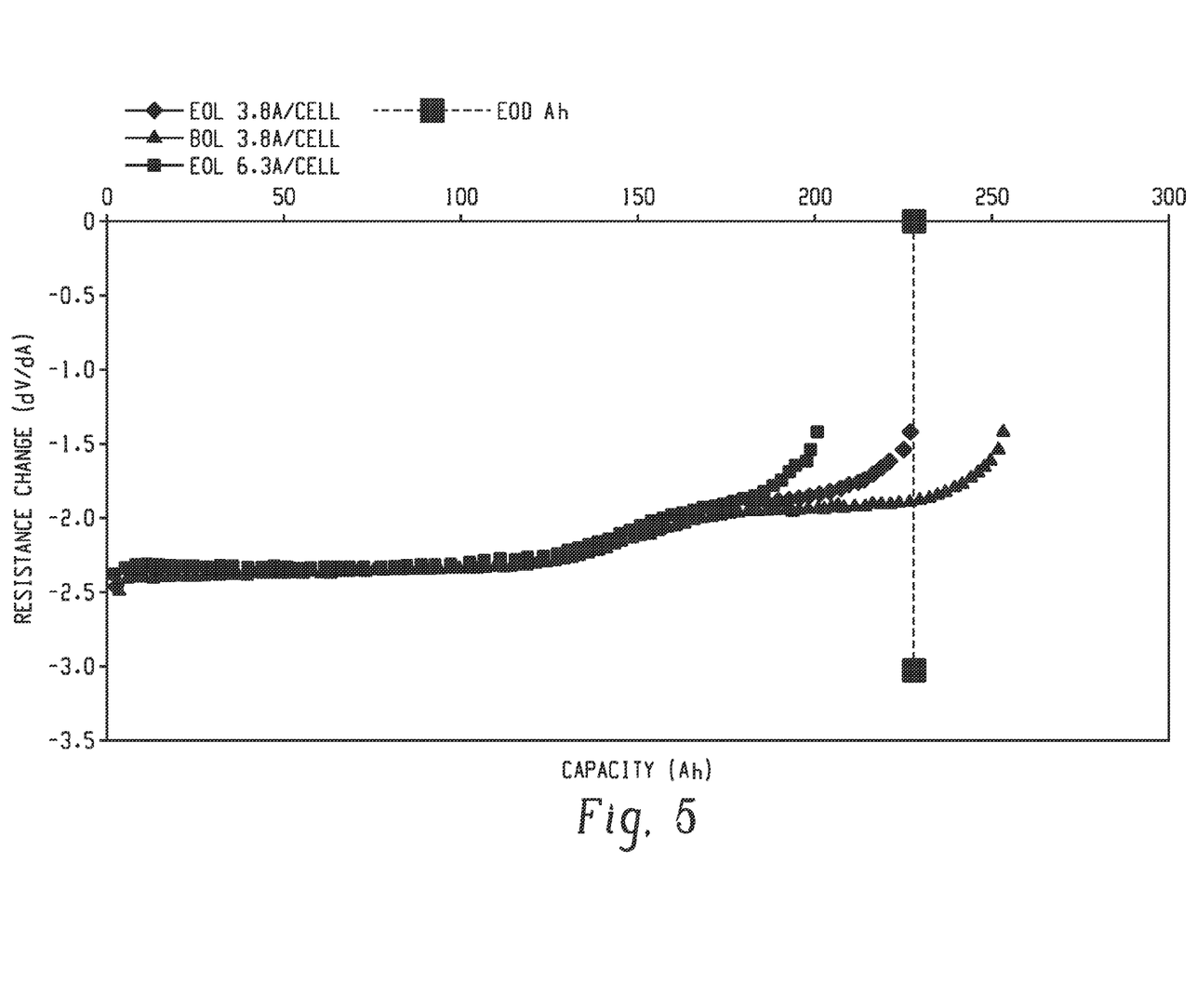
FIGS. 6A and 6B are schematic diagrams of a system and method in accordance with embodiments of the invention.
Figure 6A:
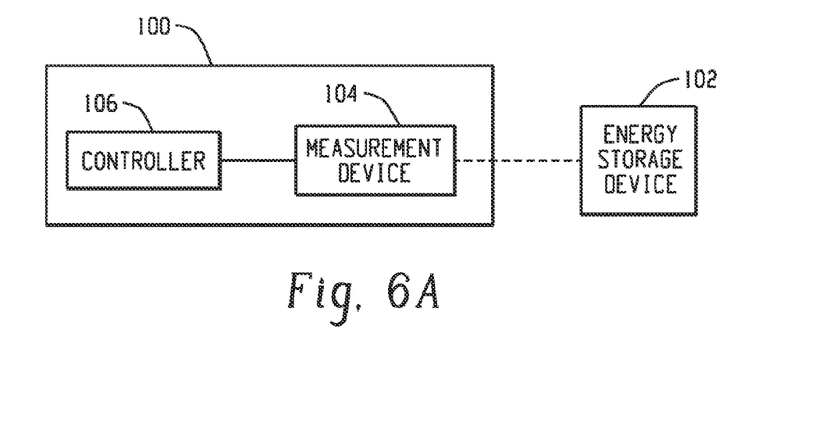
Figure 6B:
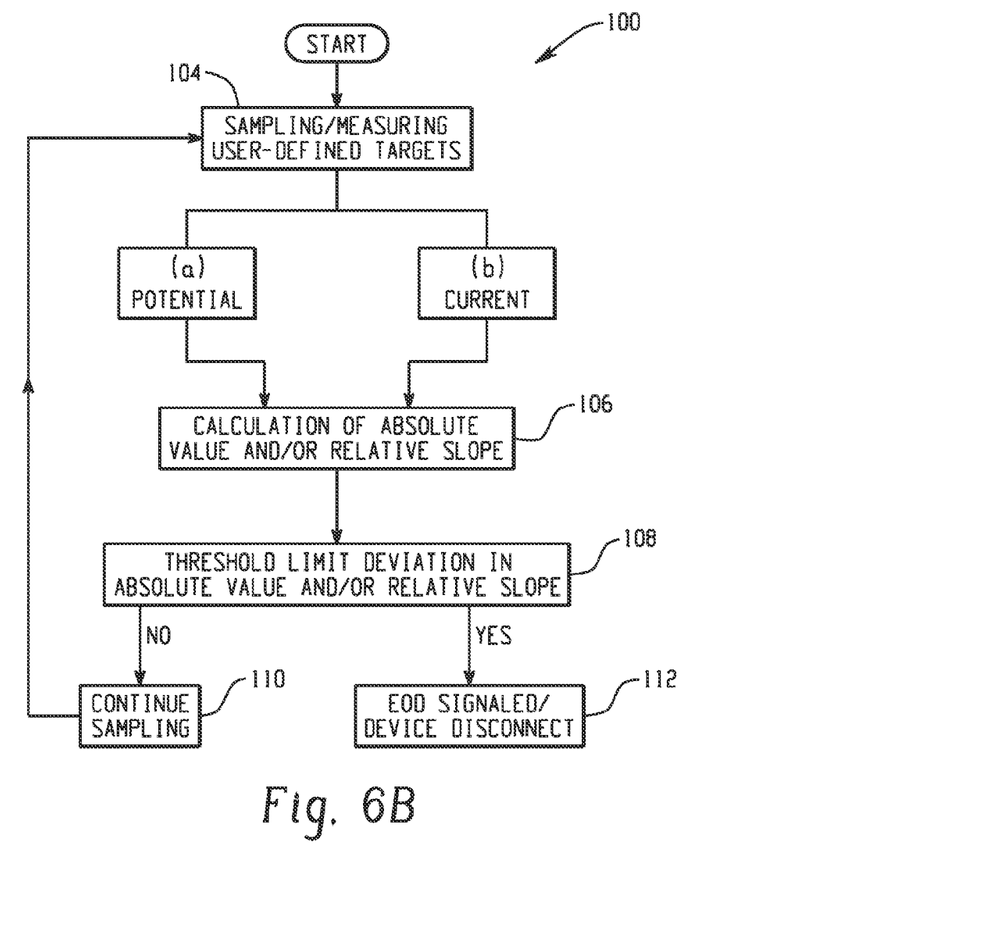

FIGS. 6A and 6B are schematic diagrams that show an embodiment of a system 100 of the present disclosure. The system is configured to be coupled to, or may include, an energy storage device 102, and monitors discharge performance in order to provide indication of EOD and/or SOH of the energy storage device 102. The system 100, as provided herein, foregoes the need for multiple performance parameter sensors, and the inclusion of correction values and prediction circuits, and focuses instead on a derivation of the relative slope of a discharge effectiveness indicator generated by the system using instantaneous measurements of defined parameters. The system 100 includes a measurement device 104 that measures (a) potential and (b) current, which are used in various ways to determine, for example recently discharged capacity which is an integral of current, or recently discharged energy which is an integral of potential*current, or resistance which is a function of $V_{oc}$, voltage and current. These measurements are fed to a controller 106 that calculates the absolute value or relative slope of the discharge effectiveness indicator(s) generated from the data points of at least two measurements. The controller may be a device that can modulate discharge, or a device that can switch to the system to recharge. When referring to identifying an EOD state of the energy storage device, the controller is generally operational to indicate a protection step, such as switching off the energy storage device, but could also affect the system to change operation states or to recharge the depleted energy storage device. The controller, then, determines if these absolute values or relative slopes have reached certain thresholds or changes in sign to determine the EOD or SOH of the device. With each calculation, the controller assesses agreement, or consistency, of the values or slopes of the indicators. If the values remain constant and are below the threshold limits 108 and 110, then the sampling/measurement and calculation functions continue. When the discharge effectiveness indicators do surpass their respective thresholds 108, an EOD signal 112 is initiated by the controller. The signal may take the form of an indicator light or other such signal to a user or operator, or in the alternative, the controller may activate a switch mechanism or other means by which the energy storage device's discharge operation is caused to cease.

An examination of the figures provided reveals that the relative slope of the discharge effectiveness indicators, and the use of a deviation in the same, as determined according to embodiments of the invention, is in substantial agreement with the actual state of discharge capability of the battery or other energy storage device. By applying the current system and method of using that system, accuracy in determining EOD may be maintained independent of variations in age of the energy storage device, or other environmental conditions.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the disclosed subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the inventive subject matter, including the best mode, and also to enable a person of ordinary skill in the art to practice the embodiments of inventive subject matter, including making and using any devices or systems and performing any incorporated methods. The patentable scope of the inventive subject matter is defined by the claims, and may include other examples that occur to a person of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described systems and methods, without departing from the spirit and scope of the inventive subject matter herein involved, it is intended that all of the subject matter of the above description or shown in the accompanying drawings shall be interpreted merely as examples illustrating the inventive concept herein and shall not be construed as limiting the inventive subject matter.

What is claimed is:

1. A method for controlling an energy storage system, the method comprising:
   (a) initiating a discharge operation in an energy storage system that is in operable communication with a controller;
   (b) measuring potential and current;
   (c) the controller performing an instantaneous calculation based on the measurements in step (b) to determine a discharge effectiveness indicator, wherein the discharge effective indicator is determined as a function of incremental energy;
   (d) generating an energy curve from the step (c) calculations and determining at least one of an absolute value or a relative slope of the discharge effectiveness indicator;
   (e) repeating steps (b)-(d) at a sampling frequency until a deviation in the at least one of the absolute value or the relative slope is detected; and
   (f) upon detecting the deviation in the at least one of the absolute value or the relative slope, the controller either signaling that the energy storage system is near end-ofdischarge, terminating the discharge operation of the energy storage system, or doing both.

2. The method of claim 1, wherein the sampling frequency comprises at least 100 times over the period of the discharge operation.

3. The method of claim 1, wherein the discharge effectiveness indicator determined in step (d) provides an instantaneous measure of the current state of health of the energy storage system.

4. The method of claim 1, wherein the deviation in the at least one of the absolute value or the relative slope correlates to an end-of-discharge state of the energy storage system.

5. The method according to claim 1, wherein the discharge effectiveness indicator is further defined by the expression:

DischEff=$V^* Int(Idt)$ wherein:
V* is potential; and
dt is differential operator of time;
and the definition of the relative slope of the discharge effectiveness indicator is defined by the expression:

Rel Slope($k$)={DischEff($k$)−DischEff($k$−1)}/{Ah($k$)−Ah($k$−1)} wherein:
k is the index for the presently derived parameter; and
k−1 is the index for the previously derived parameter.

6. The method according to claim 1, wherein the discharge effectiveness indicator is defined by the expression:

$$R_{disch(t)} = \frac{V_{oc} - V(t)}{I(t)}$$

wherein:
$R_{disch}$ is the discharge resistance of the energy storage system (Ohms);
$V_{oc}$ is the open circuit potential (Volts);
V(t) is the most recent measurement of energy storage system potential (Volts);
I(t) is the most recent measurement of current (Amps).

7. The method of claim 1, wherein discharge effectiveness indicator is based on discharge resistance and capacity as determined from the measurements from step (b), and the deviation is a positive change in the relative slope of the energy curve.

8. The method of claim 1, wherein the energy storage system comprises one or more cells or units and detecting the threshold limit is accomplished independent of variations in the cells or units of one or more of state-of-health, operating temperature, or variations resulting from manufacturing.

9. The method of claim 1, wherein terminating the discharge operation upon detecting the deviation in the at least one of the absolute value or in the relative slope prevents over-discharge of the energy storage system.

* * * * *